(12) United States Patent
Sharon et al.

(10) Patent No.: US 9,424,178 B2
(45) Date of Patent: Aug. 23, 2016

(54) OPTIMIZED FLASH MEMORY WITHOUT DEDICATED PARITY AREA AND WITH REDUCED ARRAY SIZE

(75) Inventors: Eran Sharon, Rishon Lezion (IL); Idan Alrod, Herzliya (IL); Simon Litsyn, Giv'at Shmuel (IL)

(73) Assignee: Sandisk IL Ltd., Kfar Saba (IL)

( * ) Notice: Subject to any disclaimer, the term of this patent is extended or adjusted under 35 U.S.C. 154(b) by 620 days.

(21) Appl. No.: 13/806,007

(22) PCT Filed: Jun. 21, 2011

(86) PCT No.: PCT/IB2011/052706
§ 371 (c)(1),
(2), (4) Date: Sep. 26, 2013

(87) PCT Pub. No.: WO2011/161622
PCT Pub. Date: Dec. 29, 2011

(65) Prior Publication Data
US 2014/0013033 A1  Jan. 9, 2014

Related U.S. Application Data

(60) Provisional application No. 61/356,666, filed on Jun. 21, 2010, provisional application No. 61/356,667, filed on Jun. 21, 2010.

(51) Int. Cl.
| | |
|---|---|
| *G06F 12/02* | (2006.01) |
| *H03M 13/05* | (2006.01) |
| *G06F 11/10* | (2006.01) |

(Continued)

(52) U.S. Cl.
CPC ....... *G06F 12/0246* (2013.01); *G06F 11/1072* (2013.01); *G06F 11/1076* (2013.01); *G11C 11/5628* (2013.01); *G11C 16/10* (2013.01); *H03M 13/05* (2013.01); *G11C 7/1006* (2013.01);
(Continued)

(58) Field of Classification Search
CPC .................................................... H03M 13/05
See application file for complete search history.

(56) References Cited

U.S. PATENT DOCUMENTS

| | | | |
|---|---|---|---|
| 6,847,550 | B2 | 1/2005 | Park |
| 7,643,342 | B2 | 1/2010 | Litsyn et al. |

(Continued)

FOREIGN PATENT DOCUMENTS

| | | |
|---|---|---|
| EP | 2 028 661 | 2/2009 |
| WO | WO-2009/078006 | 6/2009 |

OTHER PUBLICATIONS

International Search Report for Application No. PCT/IB2011/052706; dated Oct. 20, 2011.

(Continued)

*Primary Examiner* — Charles Rones
*Assistant Examiner* — Tian-Pong Chang
(74) *Attorney, Agent, or Firm* — Alston & Bird LLP

(57) ABSTRACT

A method and system for optimizing flash memory without dedicated parity area and with reduced array size. The memory size of a multi level cell (MLC) flash is reduced and controller operation is simplified. Simplified operation includes the controller being able to program each host data page to an integer number of flash pages. A maximal available information bits per cell (IBPC) is maintained in a flash device while also maximizing the programming throughput of the flash. Features include the ability to dynamically select which number of cell states is used by flash memory cells.

42 Claims, 7 Drawing Sheets

(51) Int. Cl.
*G11C 11/56* (2006.01)
*G11C 16/10* (2006.01)
*G11C 7/10* (2006.01)
*G11C 29/00* (2006.01)

(52) U.S. Cl.
CPC ........ *G11C 29/00* (2013.01); *G11C 2211/5641* (2013.01)

(56) References Cited

U.S. PATENT DOCUMENTS

| | | | | |
|---|---|---|---|---|
| 2002/0136054 | A1* | 9/2002 | Blodgett | G11C 11/56 365/185.03 |
| 2003/0018861 | A1* | 1/2003 | Micheloni | G06F 11/1072 711/154 |
| 2004/0080979 | A1 | 4/2004 | Park | |
| 2008/0159012 | A1* | 7/2008 | Kim | G11C 11/5621 365/189.05 |
| 2008/0250300 | A1* | 10/2008 | Mokhlesi | G11C 11/5642 714/780 |
| 2009/0055605 | A1* | 2/2009 | Wu | G11C 11/56 711/161 |
| 2009/0241009 | A1* | 9/2009 | Kong | G06F 11/1072 714/763 |
| 2010/0131806 | A1 | 5/2010 | Weingarten et al. | |

OTHER PUBLICATIONS

Sun, F., et al.; "Design of on-chip error correction systems for multilevel NOR and NAND flash memories;" IET Circuits, Devices, and Systems; vol. 1, No. 3; dated Jun. 14, 2007; pp. 241-249; retrieved on Jan. 10, 2013 from <www.ecse.rpiscrews.us/Homepages/tzhang/pub/IETFlash07.pdf>.

U.S. Appl. No. 13/086,408, filed Apr. 14, 2011.

U.S. Appl. No. 61/356,666, filed Jun. 21, 2010.

U.S. Appl. No. 61/356,667, filed Jun. 21, 2010.

Yim, K., et al.; "A Flash Compression Layer for Smartmedia Card Systems;" IEEE Transactions on Consumer Electronics; vol. 50, No. 1; dated Feb. 1, 2004; pp. 192-197; retrieved on Jan. 10, 2013 from <http://www.google.com/url?sa=t&rct=j&q=a%20flash%20compression%20layer%20for%20smartmedia%20card%20systems&source=web&cd=1&ved=0CD4QFjAA&url=http%3A%2F%2F202.38.64.11%2F~jpq%2Fpaper%2Fflash%2F2004%2520A%2520Flash%2520Compression%2520Layer%2520for%2520SmartMedia%2520Card%2520Systems.pdf&ei=8truUMLpG6i30gHrgIHIDA&usg=AFQjCNEmwwPfGvB0bZrTWO-4YKmr3KsOIQ>.

* cited by examiner

US 9,424,178 B2

OPTIMIZED FLASH MEMORY WITHOUT DEDICATED PARITY AREA AND WITH REDUCED ARRAY SIZE

CROSS-REFERENCE TO RELATED APPLICATION

This application is a national stage application filed under 35 U.S.C. 371 of International Application No. PCT/IB2011/052706, Jun. 21, 2011, which claims priority from U.S. Provisional Patent Application No. 61/356,667, filed Jun. 21, 2010, and U.S. Provisional Patent Application No. 61/356,666, filed Jun. 21, 2010, each of which is incorporated herein in its entirety.

FIELD OF THE INVENTION

The present embodiment generally relates to data storage, and in particular, it concerns reducing the amount of memory required for storing data.

BACKGROUND OF THE INVENTION

Flash memories have evolved considerably in recent years moving from storage of a single bit in each memory cell to storage of 4 cells per cell, (known as X4), in a recent product by SanDisk Corporation (Milpitas, Calif., USA). Flash memories are commonly referred to as flash and the two terms are used interchangeably in this document. Data is stored in a flash memory in a memory array, also referred to as simply memory.

Memory devices that store 1 bit per cell are known as Single Level Cell (SLC) devices. Strictly speaking, the term SLC is inaccurate, since for storage of 1 bit per cell, the cell must be able to be set to at least 2 different levels, but this term is widely used in the flash community for historical reason that count only the programmed states and not the erase state. In the context of this document, the term SLC is used to designate flash systems able to store 1 bit per cell.

Memory devices that can be set to 3 or more distinguishable physical states (sometimes called voltage thresholds, voltage levels, or simply levels, cell states, or simply states) are referred to as multi level cells (MLC).

In order to ensure reliability of data stored in a flash memory, common practice is to use Error Correcting Codes (ECCs) on the data. Popular ECCs used in flash memory are linear block codes. Such codes operate on blocks of user data, add some redundancy to the data, and generate a codeword, which is stored in the flash memory. Common notation is to denote the number of bits of user data in a block by 'k', and the codeword length is denoted as 'n'. The number of redundancy bits (the bits added by the ECC) is therefore 'n−k'. The ratio 'k/n' is known as the rate of the code, and is denoted by 'r'. Thus high rate codewords add little redundancy to the data and are able to correct a smaller number of errors, as compared to low rate codes that add more redundancy bits to the data and are able to correct a larger number of errors.

Referring to FIG. 1, a diagram of storing codewords in a flash memory, a common way of storing the codewords in the flash, is by storing the data bits in dedicated data cells, and storing the redundancy bits in dedicated parity cells. In the current figure, cells used to store user data are shown as k, total cells used for the codeword is shown as n, and redundancy cells * are shown also as n−k. Note that although the same notation (n, k, n−k) is typically used to refer to both bits and cells, the use of the notation for bits or cells will be obvious from the context of use.

The number of cells in which the 'n' codeword bits are stored is typically n/bpc, where bpc is an acronym for bits per cell (bpc). Typically, the codeword bits are programmed into the memory cells (in flash terminology the writing operation of bits to cells is referred to as programming) in pages. For example, the most significant bits (MSBs) are programmed into a first page, the vector of a next set of bits are programmed into a second page, and the least significant bits (LSBs) are programmed into a last page.

The number of information bits per cell (IBPC) is provided by dividing the size of a block of user data by the size of a codeword and multiplying that ratio by the number of bits per cell (IBPC=[[k/n]*bpc]). IBPC represents the 'true' density of the flash. IBPC has a theoretical limit that is determined by the ratio of the voltage window and the read distribution of the states programmed to that window. Thus, increasing the number of states and the redundancy at the same time (such that n/bpc remains constant) maintains the same IBPC, but reduces the programming throughput.

The data bits are typically received from a host external to the flash memory, in host pages of a given length. A desirable feature to simplify programming of the flash memory is that the codeword (or codewords) generated from a single host page occupy an integer multiple of flash pages. For example, consider a case of a host page with a size that is exactly the size of a block of user data divided by the number of bits per cell (k/bpc). Each block of user data is encoded into codewords that are the length of a codeword divided by bpc (n/bpc). In this case, the operation of the flash is relatively simple, since after receiving each host page, the host page is encoded into a codeword of length n/bpc and programmed into a single flash page. When another host page is received, another flash page (word line, WL) in the flash can be programmed.

In contrast, if a codeword generated by the ECC encoder is slightly larger than n/bpc, then part of the codeword can be programmed into a first page of the flash, while the rest of the codeword has to be stored in a temporary cache, and wait for a second codeword. After the second codeword is generated, the second codeword is concatenated to the remainder of the first codeword; then n/bpc bits of the concatenated codewords are programmed into a second page of the flash. The leftover bits will be stored temporarily, etc. This process, including temporary storage of partial codewords, complicates the flash controller, which in turn affects the performance and/or the price of the flash.

For SLC flash memories, high rate codes are sufficient, since SLCs suffer less from read errors, as compared to MLC flash memories that suffer more read errors and require use of lower rate codes. Lower rate codes result in longer codewords. The need for lower rate codes in an MLC as compared to an SLC can be understood from comparing the cell voltage distribution (CVD) of an SLC flash to a CVD of an MLC.

Referring to FIG. 2A, an exemplary plot of probability verse cell threshold voltage (also referred to as threshold voltage) in an SLC flash, 2 states (200, 202) are separated by a large voltage window 204. In the current example, the SLC cell contents may be read by comparing the cell threshold voltage with a voltage of 7 Volts. Even if there is an error of 5 Volts in the cell's actual voltage (relative to the 0 or 10 corresponding verify voltages to which the cell is programmed), the cell can be read without an error.

Referring to FIG. 2B, an exemplary plot of probability verse cell threshold voltage in an MLC flash, 4 states (210, 212, 214, 216) representing 2 bits per cell, are separated by a relatively smaller voltage window 218, as compared to the SLC voltage window 204. In contrast to the SLC memory cell that can have a voltage deviation of 5 volts, in the current MLC example only deviations of up to 2.5 Volts can be tolerated.

Therefore, in SLC flash memories the redundancy cells typically occupy only a small amount of the cell array, (typically 1%-2%), and the impact on the price of the SLC flash memory is limited. In contrast, in MLC flash memories, the code rate may be 0.9 or even less, thus implementing a flash memory with the typical architecture presented in FIG. 1 may have an impact of 10% or more on the price of the flash memory (as compared to the price of the data cells of the flash memory).

A drawback of conventional flash memories is the need to configure the flash memory for a certain level of reliability when the flash memory is first produced, verse a higher level of reliability of the flash memory as production of the flash memory matures. When a new flash memory is designed, the flash memory is targeted to certain reliability measures, and the ECC is set to accommodate the errors anticipated to be generated according to the targeted reliability. For example, if the reliability analysis requires an ECC with a code rate of 0.9, then 10% of the flash area (area of the memory array) is dedicated for the redundancy bits of the ECC codeword.

Over time, improvements are implemented in the flash memory manufacturing process as the manufacturing process reaches maturity, thus increasing the reliability of the flash memories being produced, and requiring only 5% of the flash area to be dedicated for the redundancy bits of the ECC codeword. However, the flash was already manufactured with 10% redundancy, and the cost of changing the flash design is typically prohibitive.

Options for the flash memory after the manufacturing process matures include keeping the current design while paying an extra of 5% in the area of the memory array (and thus in price), or re-designing the memory array which also has a high cost penalty. Moreover, even if a new design can be done for the memory array the ECC, which was originally designed for low rate codes when the flash memory was first produced, may not be optimal for the high rate code of the new flash, so the ECC may also be require re-design.

Another drawback of conventional flash memories is that in some cases, after producing and testing the flash, the design predictions are not exactly met. Sometimes the flash performs better than expected, (thus some flash area was wasted), and a smaller flash could have been designed. This leads to un-necessary higher cost of the flash, which is undesirable but can still be tolerated. Another case is where the flash does not meet the design predictions. This case may have severe consequences, as a new flash may have to be designed, while the first flash design becomes useless.

There is therefore a need to reduce the memory size of an MLC flash and simplify controller operation. There is also a need for maintaining a maximal available IBPC in a flash device while also maximizing the programming throughput of the flash. The present invention addresses these issues, and provides a flexible and efficient way to change the Flash's ECC without requiring costly and radical design changes.

SUMMARY

According to the teachings of the present embodiment there is provided a method for storing a plurality of data bits, the method including the steps of: encoding the plurality of data bits to generate at least one parity bit; providing a plurality of memory cells, wherein each memory cell is programmable to a plurality of cell states; and programming the plurality of memory cells to represent the plurality of data bits and the at least one parity bit by placing each memory cell in one of the plurality of cell states, wherein every memory cell is programmed to represent at least one of the plurality of data bits.

In an optional embodiment, the plurality of cell states are threshold voltage states. In another optional embodiment, each memory cell is programmed to represent exactly one parity bit. In another optional embodiment, each memory cell is programmed to represent at least one parity bit. In another optional embodiment, a number of the plurality of memory cells is an integer factor of a number of the plurality of data bits. In another optional embodiment, each memory cell is programmed to represent an equal number of the data bits. In another optional embodiment, the encoding generates a plurality of parity bits. In another optional embodiment, each memory cell is programmed to represent an equal number of the parity bits. In another optional embodiment, each memory cell is programmed to represent an equal number of the data bits. In another optional embodiment, a sum of the equal number of the parity bits and the equal number of the data bits is equal to a number of bits of each memory cell, which is logarithm (to base 2) of a number of the plurality of cell states.

In an optional embodiment, the step of programming includes: transferring the plurality of data bits to a buffer of a memory array, that also includes the plurality of memory cells; subsequent to transferring the plurality of data bits to the buffer, transferring the at least one parity bit to the buffer; and subsequent to transferring the at least one parity bit to the buffer, executing the step of programming the plurality of memory cells.

In another optional embodiment, the storing of the data bits in the buffer is substantially simultaneous with the encoding of the data bits. In another optional embodiment, the buffer includes at least one single level flash cell (SLC) wherein the data bits and the at least one parity bit are stored, and wherein each of the plurality of memory cells is a multi level flash cell (MLC). In another optional embodiment, the buffer includes at least one first data latch wherein data bits are stored and the at least one second data latch wherein the at least one parity bit are stored, and wherein each of the plurality of memory cells is a flash memory cell.

In an optional embodiment, the step of programming includes: programming the plurality of memory cells to represent the plurality of data bits; and subsequently to programming the plurality of memory cells to represent the plurality of data bits, programming the plurality of memory cells to additionally represent the at least one parity bit. In another optional embodiment, the programming of the plurality of data bits is substantially simultaneous with the encoding of the plurality of data bits.

According to the teachings of the present embodiment there is provided a method for storing a plurality of data bits, the method including the steps of: encoding the plurality of data bits to generate a plurality of parity bits; providing a plurality of memory cells, wherein each memory cell is programmable to a plurality of cell states; and programming the plurality of memory cells to represent the plurality of data bits and the plurality of parity bits by placing each memory cell in one of the plurality of cell states, wherein each of at least half of the plurality of memory cells is programmed to represent both at least one of the plurality of data bits and at least one of the plurality of parity bits.

Referring to FIG. 5, a memory device 500 includes a memory 510 with a plurality of memory cells 516. Each memory cell of the plurality of memory cells 516 is programmable to a plurality of cell states. Memory device 500 also includes a controller 502 operative to store a plurality of data bits by encoding the plurality of data bits to generate at least one parity bit. The controller 502 then programs the plurality of memory cells 516 to represent the plurality of data bits and the at least one parity bit by placing each memory cell in one of the plurality of cell states, wherein every memory cell is programmed to represent at least one of the plurality of data bits.

In another method for storing a plurality of data bits, the controller 502 of the memory device 500 uses a different technique for programming the memory cells. In this case, the controller 502 encodes the plurality of data bits to generate a plurality of parity bits. The controller 502 then programs the plurality of memory cells 516 to represent the plurality of data bits and the plurality of parity bits by placing each memory cell in one of the plurality of cell states, wherein each of at least half of the plurality of memory cells is programmed to represent both at least one of the plurality of data bits and at least one of the plurality of parity bits.

A controller 502 can store a plurality of data bits in a memory 510 that includes the plurality of memory cells 516. In this case, the controller 502 is operative to encode the plurality of data bits to generate at least one parity bit. The controller 502 is further operative to program the plurality of memory cells to represent the plurality of data bits and the at least one parity bit by placing each memory cell in one of the plurality of cell states, wherein every memory cell is programmed to represent at least one of the plurality of data bits.

In another method for storing a plurality of data bits, the controller 502 uses a different technique for programming the memory cells. In this case, the controller 502 encodes the plurality of data bits to generate a plurality of parity bits. The controller 502 then programs the plurality of memory cells 516 to represent the plurality of data bits and the plurality of parity bits by placing each memory cell in one of the plurality of cell states, wherein each of at least half of the plurality of memory cells is programmed to represent both at least one of the plurality of data bits and at least one of the plurality of parity bits.

Referring again to FIG. 6, a system 600 for storing a plurality of data bits includes a memory 510 that includes a plurality of memory cells 516. Each memory cell is programmable to a plurality of cell states. The system 600 also includes a processor 602 operative to store the plurality of data bits by encoding the plurality of data bits to generate at least one parity bit. The processor 602 is further operative to program the plurality of memory cells to represent the plurality of data bits and the at least one parity bit by placing each memory cell in one of the plurality of cell states, wherein every memory cell is programmed to represent at least one of the plurality of data bits.

In another method for storing a plurality of data bits, the processor 602 in the system 600 is operative to store the plurality of data bits by programming the plurality of memory cells to represent the plurality of data bits and the plurality of parity bits by placing each memory cell in one of the plurality of cell states, wherein each of at least half of the plurality of memory cells is programmed to represent both at least one of the plurality of data bits and at least one of the plurality of parity bits.

Mass storage device 608 is one implementation of a computer-readable storage medium having embedded thereon computer-readable code for storing a plurality of data bits. The computer-readable code includes program code for storing the plurality of data bits in a plurality of memory cells, wherein each memory cell is programmable to a plurality of cell states. The program code, typically running on a processor such as processor 602, encodes the plurality of data bits to generate at least one parity bit. The program code programs the plurality of memory cells to represent the plurality of data bits and the at least one parity bit by placing each memory cell in one of the plurality of cell states, wherein every memory cell is programmed to represent at least one of the plurality of data bits.

In another implementation, the program code programs the plurality of memory cells to represent the plurality of data bits and the plurality of parity bits by placing each memory cell in one of the plurality of cell states, wherein each of at least half of the plurality of memory cells is programmed to represent both at least one of the plurality of data bits and at least one of the plurality of parity bits.

According to the teachings of the present embodiment there is provided a method for storing a plurality of data bits, the method including the steps of: encoding the plurality of data bits to generate a codeword that includes a greater number of bits than the data bits; providing a plurality of memory cells, wherein each memory cell is programmable to a plurality of cell states, and wherein for a given integer number k of data bits stored per cell the plurality of cell states is greater than $2^k$ and less than $2^{k+1}$; and programming the plurality of memory cells to represent the codeword by placing each memory cell in one of the plurality of cell states, wherein the integer number k of bits stored per cell multiplied by a number of the plurality of memory cells is greater than or equal to a number of the data bits and less than the greater number of bits of the codeword.

In an optional embodiment, the integer number k of bits stored per cell multiplied by a number of the plurality of memory cells is equal to a number of the data bits.

In an optional embodiment, the step of programming includes: defining a set of $2^j$ virtual states greater in number than the plurality of cell states and wherein j is an integer number; mapping the codeword to the set of $2^j$ virtual states; mapping the set of $2^j$ virtual states to the plurality of cell states; and placing each of the at least one memory cell in one of the plurality of cell states. In an optional embodiment, the number of $2^j$ virtual states is $2^{(k+1)}$.

In another optional embodiment, mapping the codeword to the set of virtual states is done in a controller external to a memory including the at least one memory cell. In another optional embodiment, the set of virtual states is mapped onto the plurality of cell states.

According to the teachings of the present embodiment there is provided a method for storing a plurality of data bits, the method including the steps of: encoding the plurality of data bits to generate a codeword that includes a greater number of bits than the data bits; providing at least one memory cell, which has at least two modes of operation, wherein for each of the modes each memory cell is programmable to a respective plurality of cell states; selecting, based on a criterion related to operational performance of the at least one memory cell, one of the modes of operation for the at least one memory cell; and programming the at least one memory cell to represent the codeword by placing each of the at least one memory cell in one of the plurality of cell states associated with one of the modes of operation for the at least one memory cell.

In an optional embodiment, a number of the plurality of cell states is a non-integer power of 2. In another optional embodiment, an integer number of data bits stored per cell multiplied by a number of the at least one memory cell is greater than or equal to a number of the data bits and less than the greater number of bits of the codeword. In another optional embodiment, the integer number of data bits stored per cell multiplied by the number of the at least one memory cell is equal to the number of the data bits. In another optional embodiment, for each of the modes, the respective plurality of cell states is a non-integer power of 2. In another optional embodiment, for each of the modes, a number of the respective plurality of cell states is between two consecutive integer powers of 2. In another optional embodiment, the criterion related to operational performance of the at least one memory cell is based on a value of a parameter of the at least one memory cell selected from the group consisting of: minimal rate of programming; minimal rate of reading; reliability of programming; reliability of reading. In another optional embodiment, selecting one of the modes of operation is based on measuring a value parameter related to operational performance of the at least one memory cell, selected from the group consisting of: rate of programming; rate of reading; reliability of programming; reliability of reading. In another optional embodiment, the step of selecting is done during manufacturing. In another optional embodiment, the step of selecting is done during power-on. In another optional embodiment, the step of selecting is done by setting one or more non-volatile elements associated with the at least one memory cell. In another optional embodiment, the step of selecting is done in response to a command issued to the at least one memory cell by an external host. In another optional embodiment, the step of programming is single-cell based.

According to the teachings of the present embodiment there is provided a method for storing a plurality of data bits, the method including the steps of: encoding the plurality of data bits to generate a codeword that includes a greater number of bits than the data bits; providing a plurality of memory cells, wherein each memory cell is programmable to a plurality of cell states, and wherein for a given integer number k of data bits stored per cell the plurality of cell states is greater than $2^k$ and less than $2^{k+1}$; and programming the plurality of memory cells to represent the codeword by placing each memory cell in one of the plurality of cell states, wherein the integer number k of bits stored per cell multiplied by a number of the plurality of memory cells is less than the greater number of bits of the codeword, and wherein programming is single-cell based.

According to the teachings of the present embodiment there is provided a method for storing a plurality of bits, the method including the steps of: providing a memory including a plurality of memory cells, wherein each memory cell is programmable to a plurality of cell states, and wherein for a given integer number k the plurality of cell states is greater than $2^k$ and less than $2^{k+1}$; and programming the plurality of memory cells to represent the bits by: receiving from a controller external to the memory the bits in bit patterns of length k+1 for each memory cell; mapping, in the memory, the bit patterns to the plurality of cell states using a many-to-one mapping; and placing each memory cell in one of the plurality of cell states respectively corresponding to a bit pattern for each memory cell.

In an embodiment, the step of programming includes receiving by the memory one of $2^{k+1}$ bit patterns of k+1 bits each, for each memory cell and mapping each of the bit patterns to one of the plurality of cell states.

According to the teachings of the present embodiment there is provided a method for storing a plurality of bits, the method including the steps of: providing at least one memory cell, which has at least two modes of operation, wherein for each of the modes each memory cell is programmable to a respective plurality of cell states; selecting, based on a criterion related to operational performance of the at least one memory cell, one of the modes of operation for the at least one memory cell; and programming the at least one memory cell to represent the bits by placing each of the at least one memory cell in one of the plurality of cell states associated with one of the modes of operation for the at least one memory cell.

Referring again to FIG. 5, a memory device 500 includes a plurality of memory cells 516, wherein each memory cell is programmable to a plurality of cell states, and wherein for a given integer number k of data bits stored per cell the plurality of cell states is greater than $2^k$ and less than $2^{k+1}$. The memory device also includes a controller 502 operative to store a plurality of data bits by encoding the plurality of data bits to generate a codeword that includes a greater number of bits than the data bits. The controller is further operational to program the plurality of memory cells to represent the codeword by placing each memory cell in one of the plurality of cell states, wherein the integer number k of bits stored per cell multiplied by a number of the plurality of memory cells is greater than or equal to a number of the data bits and less than the greater number of bits of the codeword.

A memory device 500 includes at least one memory cell 516, which has at least two modes of operation, wherein for each of the modes, each memory cell is programmable to a respective plurality of cell states. The memory device also includes a controller 502 operative to store a plurality of data bits by encoding the plurality of data bits to generate a codeword that includes a greater number of bits than the data bits. The controller selects, based on a criterion related to operational performance of the at least one memory cell, one of the modes of operation for the at least one memory cell. Finally, the controller programs the at least one memory cell to represent the codeword by placing each of the at least one memory cell in one of the plurality of cell states associated with one of the modes of operation for the at least one memory cell.

Optionally, the controller is further operative to define a set of virtual states greater in number than the plurality of cell states and map the codeword to the set of virtual states. The set of virtual states is mapped to the plurality of cell states and each of the at least one memory cell is placed in one of the plurality of cell states.

In another implementation, the memory device 500 includes a memory 510 including a plurality of memory cells 516, wherein each memory cell is programmable to a plurality of cell states, and wherein for a given integer number k the plurality of cell states is greater than $2^k$ and less than $2^{k+1}$. A controller 502 is operative to store a plurality of data bits by sending to the memory 510 the bits in bit patterns of length k+1 for each memory cell 516. In the memory 510, the bit patterns are mapped to the plurality of cell states using a many-to-one mapping. Mapping can be done by a memory mapper 512. Each memory cell is placed in one of the plurality of cell states respectively corresponding to a bit pattern for each memory cell 516.

In general, bits can be stored in a memory device 500 where the memory device 500 includes a memory 510 including at least one memory cell 516. Each memory cell 516 is programmable to a plurality of cell states. The memory device 500 also includes a controller operative to store a plurality of bits by selecting, based on a criterion related to operational performance of the at least one memory cell 516, the plurality of cell states; programming the at least one memory cell to represent the bits by placing each of the at least one memory cell in one of the plurality of cell states.

A controller 502 can be used for storing a plurality of data bits in a plurality of memory cells 516, wherein each memory cell 516 is programmable to a plurality of cell states, and wherein for a given integer number k of data bits stored per cell the plurality of cell states is greater than $2^k$ and less than $2^{k+1}$. In this case, the controller is operative to encode the plurality of data bits to generate a codeword that includes a greater number of bits than the data bits; and program the plurality of memory cells to represent the codeword by placing each memory cell in one of the plurality of cell states, wherein the integer number k of bits stored per cell multiplied by a number of the plurality of memory cells is greater than or equal to a number of the data bits and less than the greater number of bits of the codeword.

A controller 502 can facilitate storing a plurality of data bits in at least one memory cell 516 which has at least two modes of operation, wherein for each of the modes, each memory cell 516 is programmable to a respective plurality of cell states, the controller 502 being operative to encode the plurality of data bits to generate a codeword that includes a greater number of bits than the data bits; select, based on a criterion related to operational performance of the at least one memory cell, one of the modes of operation for the at least one memory cell; and program the at least one memory cell to represent the codeword by placing each of the at least one memory cell in one of the plurality of cell states associated with one of the modes of operation for the at least one memory cell.

In another implementation, a controller 502 can facilitate storing a plurality of data bits in a memory 510. The memory 510 includes a plurality of memory cells 516, wherein each memory cell 516 is programmable to a plurality of cell states, and wherein for a given integer number k the plurality of cell states is greater than $2^k$ and less than $2^{k+1}$. In this case, the controller 502 is operative to send to the memory 510 the bits in bit patterns of length k+1 for each memory cell 516; map, in the memory via memory mapper 512, the bit patterns to the plurality of cell states using a many-to-one mapping; and place each memory cell in one of the plurality of cell states respectively corresponding to a bit pattern for each memory cell.

In general, a controller 502 can facilitate storing a plurality of bits in a memory 510. The memory 510 including at least one memory cell 516, wherein each memory cell 516 is programmable to a plurality of cell states, the controller 502 being operative to select, based on a criterion related to operational performance of the at least one memory cell 516, the plurality of cell states; and program the at least one memory cell 516 to represent the bits by placing each of the at least one memory cell 516 in one of the plurality of cell states.

Referring to FIG. 6, a system 600 for storing a plurality of data bits includes a memory 510 that includes a plurality of memory cells 516, wherein each memory cell 516 is programmable to a plurality of cell states, and wherein for a given integer number k of data bits stored per cell the plurality of cell states is greater than $2^k$ and less than $2^{k+1}$. The system 600 includes a processor 602 operative to store the plurality of data bits by encoding the plurality of data bits to generate a codeword that includes a greater number of bits than the data bits; and programming the plurality of memory cells 516 to represent the codeword by placing each memory cell 516 in one of the plurality of cell states, wherein the integer number k of bits stored per cell multiplied by a number of the plurality of memory cells is greater than or equal to a number of the data bits and less than the greater number of bits of the codeword.

A system 600 for storing a plurality of data bits includes at least one memory cell 516, which has at least two modes of operation. For each of the modes, each memory cell 516 is programmable to a respective plurality of cell states. The system 600 also includes a processor 602 operative to store the plurality of data bits by: encoding the plurality of data bits to generate a codeword that includes a greater number of bits than the data bits; selecting, based on a criterion related to operational performance of the at least one memory cell 516, one of the modes of operation for the at least one memory cell 516; and programming the at least one memory cell 516 to represent the codeword by placing each of the at least one memory cell 516 in one of the plurality of cell states associated with one of the modes of operation for the at least one memory cell.

A system 600 for storing a plurality of data bits includes a memory 510 including a plurality of memory cells 516. Each memory cell 516 is programmable to a plurality of cell states, and wherein for a given integer number k the plurality of cell states is greater than $2^k$ and less than $2^{k+1}$. The system 600 includes a processor 602 operative to store the plurality of data bits by sending to the memory the bits in bit patterns of length k+1 for each memory cell. In the memory 510, the bit patterns are mapped by memory mapper 512 to the plurality of cell states using a many-to-one mapping and each memory cell 516 is placed in one of the plurality of cell states respectively corresponding to a bit pattern for each memory cell 516.

In general, a system 600 for storing a plurality of bits includes a memory 510 including at least one memory cell 516, wherein each memory cell 516 is programmable to a plurality of cell states. The system 600 includes a processor 602 operative to store the plurality of bits by: selecting, based on a criterion related to operational performance of the at least one memory cell 516, the plurality of cell states; and programming the at least one memory cell 516 to represent the bits by placing each of the at least one memory cell 516 in one of the plurality of cell states 516.

Mass storage device 608 is one implementation of a computer-readable storage medium having embedded thereon computer-readable code for storing a plurality of data bits, the computer-readable code including program code for storing the plurality of data bits in a plurality of memory cells 516, wherein each memory cell 516 is programmable to a plurality of cell states, and wherein for a given integer number k of data bits stored per cell the plurality of cell states is greater than $2^k$ and less than $2^{k+1}$. The program code, typically running on a processor such as processor 602, encodes the plurality of data bits to generate a codeword that includes a greater number of bits than the data bits. The program code programs the plurality of memory cells to represent the codeword by placing each memory cell in one of the plurality of cell states, wherein the integer number k of bits stored per cell multiplied by a number of the plurality of memory cells is greater than or equal to a number of the data bits and less than the greater number of bits of the codeword.

In another implementation, the at least one memory cell 516 has at least two modes of operation, wherein for each of the modes, each memory cell 516 is programmable to a respective plurality of cell states, and the program code encodes the plurality of data bits to generate a codeword that includes a greater number of bits than the data bits. The program code selects based on a criterion related to operational performance of the at least one memory cell 516, one of the modes of operation for the at least one memory cell 516; and programs the at least one memory cell to represent the codeword by placing each of the at least one memory cell in one of the plurality of cell states associated with one of the modes of operation for the at least one memory cell.

A computer-readable storage medium has embedded thereon computer-readable code for storing a plurality of data bits. The computer-readable code including program code for storing the plurality of data bits in a memory 510, the memory 510 including a plurality of memory cells 516, wherein each memory cell 516 is programmable to a plurality of cell states, and wherein for a given integer number k the plurality of cell states is greater than $2^k$ and less than $2^{k+1}$ by: sending to the memory the bits in bit patterns of length k+1 for each memory cell; mapping, in the memory by memory mapper 512, the bit patterns to the plurality of cell states using a many-to-one mapping; and placing each memory cell in one of the plurality of cell states respectively corresponding to a bit pattern for each memory cell.

A computer-readable storage medium having embedded thereon computer-readable code for storing a plurality of bits in a memory 510, the computer-readable code including program code for storing the plurality of bits in the memory 510 including at least one memory cell 516, wherein each memory cell is programmable to a plurality of cell states by: selecting, based on a criterion related to operational performance of the at least one memory cell 516, the plurality of cell states; and programming the at least one memory cell 516 to represent the bits by placing each of the at least one memory cell 516 in one of the plurality of cell states.

BRIEF DESCRIPTION OF FIGURES

The embodiment is herein described, by way of example only, with reference to the accompanying drawings, wherein.

DETAILED DESCRIPTION

The principles and operation according to a present embodiment may be better understood with reference to the drawings and the accompanying description. A present embodiment is a method and system for optimizing flash memory without dedicated parity area and with reduced array size. The embodiment facilitates reducing the memory size of a multi level cell (MLC) flash and simplifying controller operation. Simplified operation includes the controller being able to program each host data page to an integer number of flash pages. The embodiment also facilitates maintaining a maximal available information bits per cell (IBPC) in a flash device while also maximizing the programming throughput of the flash. A feature of the present embodiment is the ability to dynamically select which number of cell states is used by flash memory cells.

Figure 1:
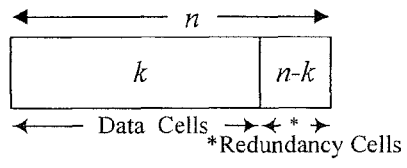
FIG. 1, a diagram of storing codewords in a flash memory.
Figure 2A:
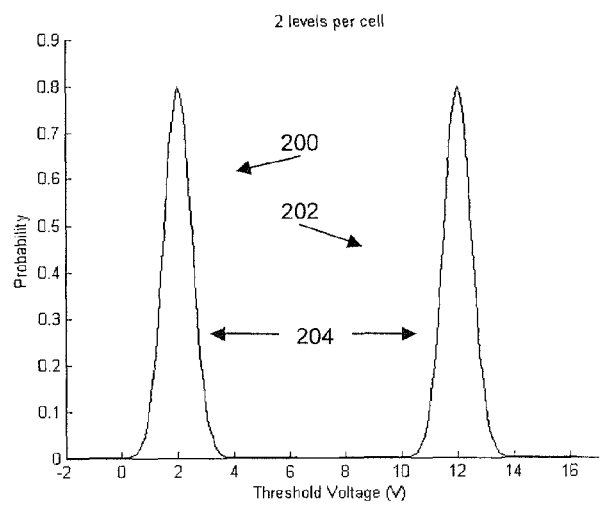
FIG. 2A, an exemplary plot of probability verse cell threshold voltage in an SLC flash.
Figure 2B:
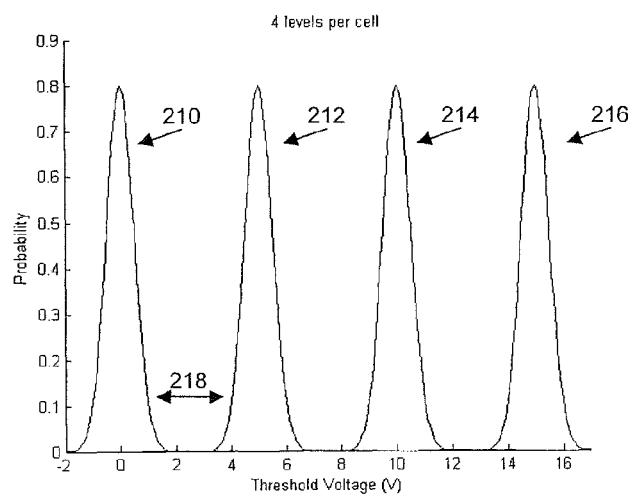
FIG. 2B, an exemplary plot of probability verse cell threshold voltage in an MLC flash.
Figure 3A:
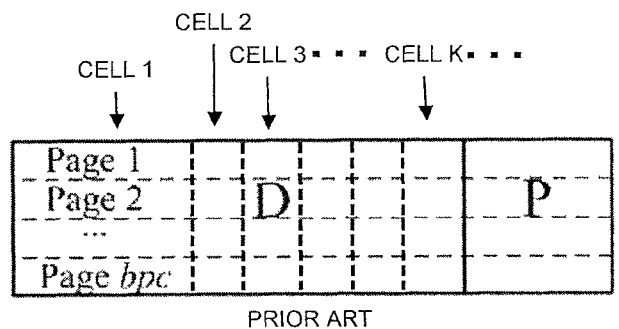
FIG. 3A is a sketch of a partitioning of a conventional flash memory.

Referring now to the drawings, FIG. 3A is a sketch of a partitioning of a conventional flash memory that is partitioned into dedicated storage areas for storing data D and storing parity P (also known as a redundancy area). One or more cells (CELL 1, CELL 2, CELL 3, . . . , CELL K) each store one or more bits in pages (Page 1, Page 2, . . . , Page bpc), as in known in the art and has been described in the background section of this document. A conventional technique for MLC flash memories is to program codewords into flash pages, wherein the same encoding is used on all pages. Thus, each page contains an equal amount of data D and an equal amount of parity bits P (in a dedicated parity area).

Figure 3B:
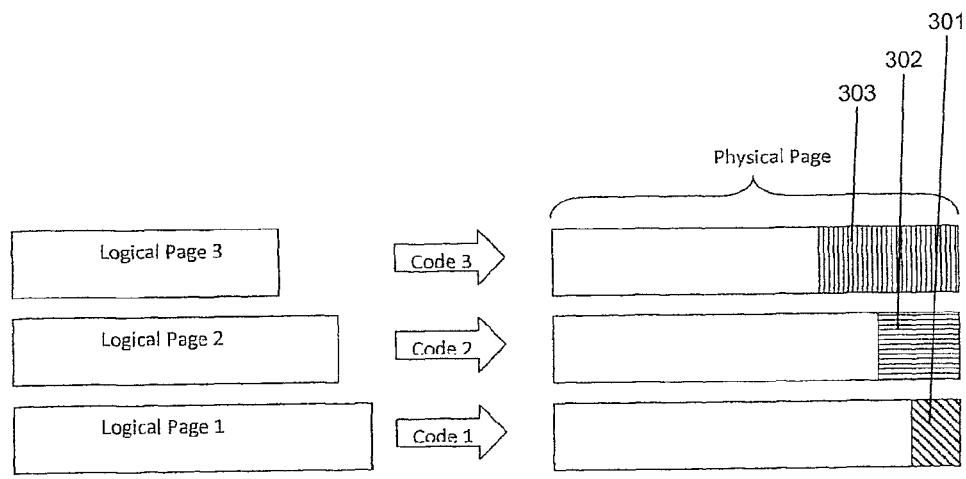
FIG. 3B, a diagram of a technique for using different encodings for each page.

A technique is taught by Densbits Technologies LTD in WO 2009/078006 Apparatus for Coding at a Plurality of Rates in Multi-Level Flash Memory Systems, and Methods Useful in Conjunction Therewith for encoding with different codes for each page. Referring to FIG. 3B, a diagram of a technique for using different encodings for each page, each page has a different amount of data (Logical Page 3, Logical Page 2, Logical Page 1) and a different amount of parity (303, 302, 301). As in conventional flash memories, there is a dedicated parity area that is in addition to the number of cells required for data storage. As the amount of data in each page is different, this technique requires additional complexity in the controller.

A technique taught by F. Sun, Et Al in paper *Design of on-chip error correction systems for multilevel NOR and NAND flash memories*, (IET Circuits, Devices and Systems, vol. 1, no. 3, pp. 241-249, June 2007) deals with adding pages to the flash memory cells in order to allow storage of larger codewords in the same amount of cells. This paper studies the tradeoffs between various TCM codes applied to a flash cell array initially designed for 4 levels (2 bits per cell). In the paper partitions into 6, 8, and 12 levels are studied, wherein for each of the higher levels a stronger (longer) code compensates for the increased BER related to the dense levels. The technique of this paper does not reduce the number of cells required for storing data, and requires a dedicated parity area where in each case the amount of dedicated parity area is more or less equal.

Other conventional techniques include using finer partitions of the memory cells and stronger codes, however in these techniques still require a dedicated data area and dedicated parity area for each logical page.

Figure 4:
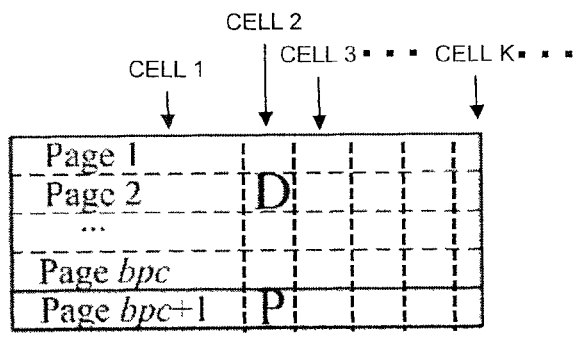
FIG. 4, a diagram of a flash memory without dedicated parity area.

In contrast to conventional techniques, the present embodiment includes an innovative approach to the partitioning of the cells that are provided to store a codeword. Referring to FIG. 4, a diagram of a flash memory without dedicated parity area, both the data and redundancy information occupy the same memory cells. Parity or redundancy information is stored without the need for a dedicated parity area for redundancy information. Conventional implementations require additional cells with corresponding additional space needed on the memory and additional cost of the memory. The current embodiment can be implemented without additional cells, resulting in a relatively smaller, reduced, memory array size and lower cost than conventional implementations.

The current embodiment uses only an amount of cells that are required for data, and programs additional bit(s) into the same amount of cells. Adding additional bits into an existing cell causes the cell to be less reliable than a cell with an original number of bits. This concern can be addressed by using lower code rates (larger codewords) to store data in cells with additional bits than would be used to store data in cells with the original number of bits.

In a non-limiting example, adding a $4^{th}$ page to each cell in a X3 flash device results in the use of an X4 flash device, and enables codewords with up to 25% redundancy while using only the original number of data cells. Redundancy information such as parity bits can be stored using the $4^{th}$ page. A properly designed code with a code rate of 0.75 for an X4 partitioning of the cells can be more reliable than a code with 10% redundancy using an extra 10% number of X3 cells.

In a case where the number of memory cells used to store the data is an integer factor of the number of data bits in a codeword, there are additional advantages in terms of simplicity of the controller of the flash. In other words, data bits are provided in pages that are a multiple of the number of memory cells being used to store the data bits. In the context of this document, the term factor has the common mathematical meaning of one of two or more numbers that when multiplied together produce a given product and/or an integer factor is an integer that when multiplied by another integer results in an integer product. In this case, programming the data into the flash is done by programming an integer number of full pages. The parity information may be added into the parity page after receiving the parity bits from an encoder, such as an ECC encoder.

A preferred implementation is to transfer the data bits to the flash memory immediately as the data bits are read from a host. When the parity bits are generated, the parity bits can subsequently be transferred to the flash memory to the parity page(s), such that each cell stores the same number of parity bits. Furthermore, during computation of the parity bits the data bits can be sent to the flash thus providing an optimal pipeline for storage from the host to a flash memory. A technique for updating a flash memory with new/additional information, after an initial programming, can be found in U.S. patent application Ser. No. 13/086,408, Multiple Programming of Flash Memory Without Erase.

In a non-limiting example of a technique for writing data and then parity, the data bits are read from the host and copied into a first set of data latches in buffer 514. Once the parity bits are computed, the parity bits are copied into a second set of data latches in buffer 514. After all the data bits and parity bits have been copied into the data latches of buffer 514, the memory cells 516 are programmed.

In another non-limiting example, the data bits are read from the host and programmed into an SLC partition of flash cells 516. Once the parity bits are computed, the parity bits are also programmed into the SLC partition of flash cells 516. After all the data bits and parity bits have been programmed into SLC pages, a corresponding MLC word line of the flash cells 516 can be programmed by copying the SLC pages into the MLC word line.

While the above-described technique is preferred, the present embodiment can be applied in general to programming codewords into a plurality of flash cells such that there is no dedicated area for parity. In a non-limiting example, each cell in the memory stores at least 1 data bit. In a case where the number of data bits being stored does not match the number of parity bits being stored, additional memory cells can be used to store parity bits in excess of the memory cells being used to store the data bits. In this case, a majority of the cells have both data and parity, or in other words, at least half the memory cells are programmed to represent both data and parity bits.

Figure 5:
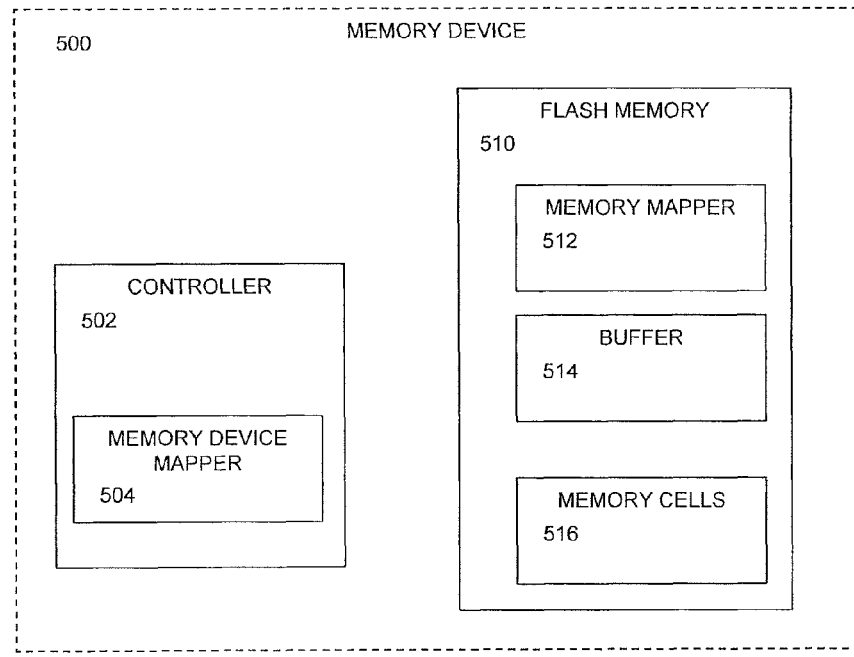
FIG. 5, a simplified diagram of a memory device.

Referring to FIG. 5, a simplified diagram of a memory device 500 includes a controller 502 and a flash memory 510. Optionally the memory device 500 includes a memory device mapper 504, typically implemented in the controller 502. The flash memory 510 optionally includes a memory mapper 512, optionally includes a buffer 514, and includes memory cells 516. In the context of this document, the term memory generally refers to a memory containing memory cells, in comparison to the term memory device that generally refers to the combination of memory and a controller.

Figure 6:
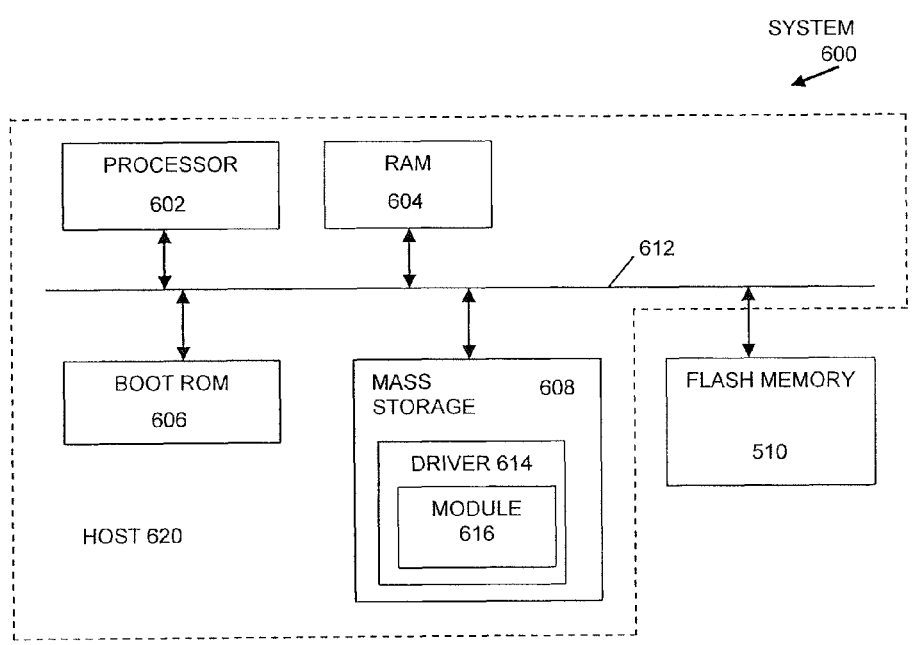
FIG. 6 is a high-level block diagram of a system of the present embodiment.

FIG. 6 is a high-level block diagram of a system 600 of the present embodiment. System 600 includes a processor 602 and four memory devices: a RAM 604, a boot ROM 606, a mass storage device (hard disk) 608 and a flash memory 610, all communicating via a common bus 612. Flash memory 610 could include, for example, the components of the flash memory 610 of FIG. 5. System 600 could include, for example, the components of the flash memory device 500 of FIG. 5, with controller 502 and/or memory device mapper 504 being emulated by the execution of software on system 600, for example by processor 602. A software driver 614 for flash memory 610 is stored in mass storage device 608 and is executed by processor 602 to access flash memory 610. Driver 614 includes a module 616 for encoding data to be stored in flash memory 610, and for decoding codewords received from flash memory 610, using the methodology described herein.

In FIG. 6, the components of system 600 other than flash memory 610 constitute a host 620 for flash memory 610. Mass storage device 608 is an example of a computer-readable storage medium bearing computer-readable code for implementing the data storage methodology described herein. Other examples of such computer-readable storage media include read-only memories such as CDs bearing such code.

Bits, or depending on the application more specifically user data bits, are sent from the host 620 to the controller 502. Alternatively, the bits are sent to processor 602 that implements a controller process/emulator. The bits are processed by the controller to produce redundancy information, including parity bits or codewords. An example of controller processing is an ECC encoder. Optionally, the redundancy information is mapped by the memory device mapper 504 in the controller 502. The bits (mapped bits, codewords) are sent to the flash memory 510 for storage. If the bits have already been mapped in the controller, the flash memory can use the mapping of the memory device mapper 504. Optionally, the bits can be mapped/re-mapped in the flash memory 510 by a memory mapper 512. The resulting bits are then programmed into memory cells 516.

Figure 7:
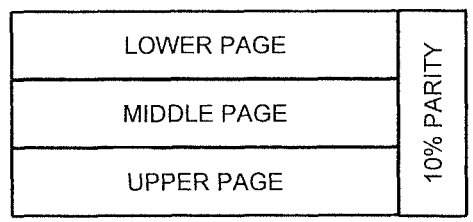
FIG. 7, diagram of conventional storage of 10% parity.

The following non-limiting examples are provided to clarify the present embodiment. The examples used to assist in the description of this embodiment should not detract from the scope of applicability, validity, and utility of the invention. In a first example, consider a host with host pages of 1024 bits each. A typical conventional X3 system would read 3 host pages and store them in 1024 X3 cells. In addition, the 3 host pages will be encoded by an ECC with a code rate of ~0.9, generating approximately 300 parity bits. The additional 300 parity bits will be stored in an additional 100 cells, as illustrated in FIG. 7, diagram of conventional storage of 10% parity.

Figure 8:
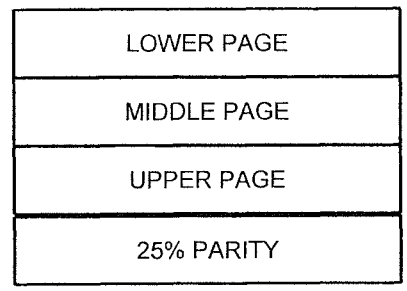
FIG. 8, diagram of storage of 25% parity without a dedicated parity area.

In contrast, according to the present embodiment, the 1024 cells used for storing the data use an X4 partition, that is, each cell will be partitioned into 16 states. The distance between adjacent states is reduced; therefore, the error rate will increase above the error rate of an X3 system. To compensate for the higher error rate, a code with a code rate of 0.75 will be used thus adding an additional 1024 parity bits. The parity bits will be stored in the same cells as the information bits, as illustrated in FIG. 8, diagram of storage of 25% parity without a dedicated parity area. Thus, no additional memory cells are required in this implementation.

Figure 15:
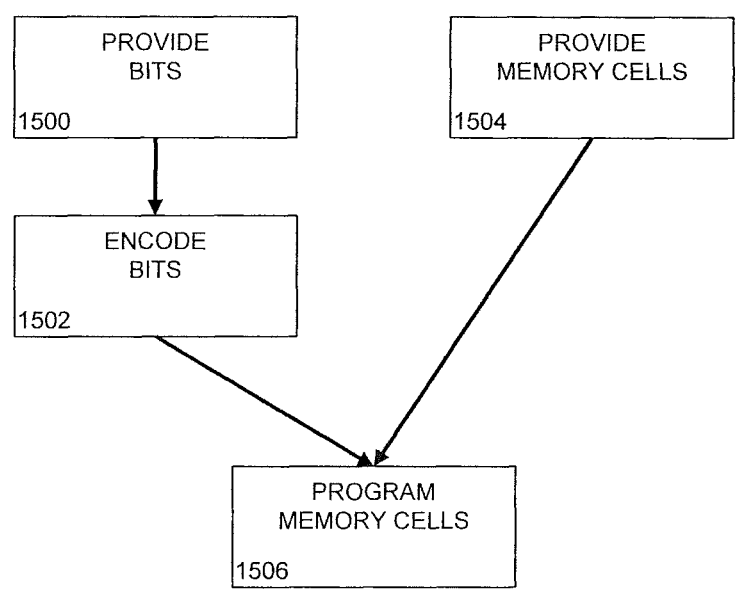
FIG. 15, a flowchart of a method for storing bits

Referring to FIG. 15, a flowchart of a method for storing bits, bits to be stored are provided 1500. Typically, the bits are data bits from a user, and a plurality of data bits are provided. The bits are encoded 1502 to generate at least one parity bit. Optionally and typically, a plurality of parity bits are generated. The present embodiment can be applied in general to any bits without distinguishing the type of bits. For clarity, the original bits to be stored are referred to in this description as data bits, as compared to the bits generated from the data bits, which are referred to as parity bits. In general, parity bits are redundancy information for the data bits, and the specific type of redundancy/parity bits generated will depend on the specific application.

This application claims the benefit of provisional patent applications (PPA) Ser. Nos. 61/356,666 ML Flash memories without Dedicated Parity Area, and USA 61/356,667 BX3 both filed Jun. 21, 2010 by the present inventors, which are incorporated by reference.

A plurality of memory cells are provided 1504 to store the data bits and the parity bits. Each memory cell is programmable to a plurality of cell states. As described above, in flash memory technology the operation of writing bits to cells is referred to as programming. An SLC memory cells can be programmed, or set, to 2 different cell states, and an MLC flash memory cell can be programmed, or set, to at least 3 distinguishable physical states. Each cell state represents a combination of one or more bits, and setting a cell to one of the cell states programs that cell with the bits corresponding to that cell state. In other words, each memory cell can be placed, or set, to one of a plurality of cell states. Placing a memory cell in a cell state effectively programs the memory cell to represent the bits corresponding to the cell state in which the memory cell has been placed.

The plurality of memory cells are programmed 1506 to represent the plurality of data bits and the at least one parity bit by placing each memory cell in one of the plurality of cell states, wherein every memory cell is programmed to represent at least one of the plurality of data bits. Optionally, each memory cell is programmed to represent exactly one parity bit. Optionally, each memory cell is programmed to represent at least one parity bit. Typically, the plurality of cell states are determined by a corresponding plurality of threshold voltages, and are referred to as threshold voltage states.

Preferably, the data bits are provided in pages that are a multiple of the number (amount) of memory cells. In this case, the number of memory cells is an integer factor of the number (amount) of the data bits. Programming options include each memory cell being programmed to represent an equal number of the data bits and/or each memory cell being programmed to represent an equal number of the parity bits. In another option, the number of data bits is different from the number of parity bits.

The mapping of bit-strings into memory cell states is preferably done at either memory device mapper 504 or memory mapper 512. The mapping is typically done by partitioning the codeword to be programmed to the flash memory, (data bits and parity bits), into strings of equal length. Each string is mapped into a state of a single cell, or a combination of states of more than one cell. A mapping that maps each string into a state of a single cell is called single cell based mapping. For example, consider an MLC flash memory storing b-bits per cell, (i.e. having $2^b$ possible states). Partitioning the code word into strings of equal length b, and mapping each of the $2^b$ possible strings to a corresponding state results in the well-known mapping of common MLC flash memory systems. Another example, consider a flash memory with 3 states per cell. In this case combining 2 cells together results in 9 possible states. Partitioning the code word into strings of equal length 3, and mapping each of the 8 possible strings to one of the 9 states of the 2 cells results in a mapping that maps strings of length 3 into 8 out of 9 of the combination of states of 2 cells. In this example, not all combinations of states of a 2 cells will be achieved by the mapping. A mapping that does not exclude any of the states in the target of the mapping is said to be "onto". The first example above was onto since every state has a string of b-bits associated with the states. The second example is not onto, since the target is combinations of states of 2 cells, and not every combination of states of 2 cells can be achieved by the mapping.

A buffer can be used to store the data bits and then store the parity bits in the memory cells. In this case, the step of programming includes transferring the plurality of data bits to a buffer of a memory array. The memory array includes the plurality of memory cells. Subsequent to transferring the plurality of data bits to the buffer, at least one parity bit is transferred to the buffer. Subsequent to transferring the at least one parity bit to the buffer, the plurality of memory cells are programmed with the data and parity bits. Preferably, the storing of the data bits in the buffer is substantially simultaneous with the encoding of the data bits to generate parity bits. A variety of implementations are possible for the buffer, depending on the specific requirements of the application.

In one implementation, the buffer includes at least one single level flash cell (SLC), and typically a plurality of SLCs. The data bits and then the parity bits are initially stored in the SLC, and then programmed into a plurality of memory cells. In this case, the memory cells are preferably multi level flash cells (MLCs). In another implementation, the buffer includes at least one data latch, and typically a plurality of data latches. Similar to the previously described use of a buffer of SLCs, the data bits and then the parity bits are initially stored in the data latches, and then programmed into a plurality of memory cells.

An alternative to using a buffer to store the data bits and then store the parity bits, is to store the data and then parity bits directly into the memory cells. In this case, the plurality of memory cells are initially programmed to represent the plurality of data bits. Subsequent to programming the plurality of memory cells to represent the plurality of data bits, the memory cells are programmed to additionally represent the at least one parity bit. Preferably, the programming of the data bits in the memory cells is substantially simultaneous with the encoding of the data bits to generate parity bits. A technique for updating a flash memory with new/additional information, after an initial programming, is discussed above in relation to U.S. patent application Ser. No. 13/086, 408.

Referring again to FIG. 15, another method for storing a plurality of data bits uses a different technique for programming the memory cells. In this case, the step of encoding 1502 the bits to generate at least one parity bit generates a plurality of parity bits. In this case, the plurality of memory cells are programmed 1506 to represent the plurality of data bits and the plurality of parity bits by placing each memory cell in one of the plurality of cell states, wherein each of at least half of the plurality of memory cells is programmed to represent both at least one of the plurality of data bits and at least one of the plurality of parity bits. In other words, a majority subset of the memory cells are programmed with both data and parity bits.

The above-described method is highly effective. However, in certain cases achieving higher programming and read performance with reduced complexity is desirable. The above-described method addresses the issues of reducing the memory size of an MLC Flash and simplifying the controller such that each host data page may be programmed to an integer number of flash pages. This method typically increases the number of states per cell from $2^k$ to $2^{k+1}$ (that is, doubles the number of states per cell). In certain cases, avoiding this increase in the number of states is desirable. The below-described method for storing bits uses an innovative dynamic partitioning of cell states that can achieve a relatively higher programming and read performance with reduced complexity, as compared to conventional implementations. Mapping of bits to cell states can be onto and single-cell based mapping is possible, where the data can be partitioned into disjoint sets of bits, and each set of bits affects only the state of a single cell.

Conventional techniques for partitioning a flash memory into a number of physical states that are not a power of 2, are known in the art. U.S. Pat. No. 6,847,550 to Park for Nonvolatile semiconductor memory having three-level memory cells and program and read mapping circuits therefore teaches a method of partitioning of a memory cell into 3 states. The mapping is not onto, that is mapping 1 bit into 2 of the 3 states of a cell or mapping 3 bits into 8 states out of 9 of 2 3-level cells. These conventional techniques do not address dynamic portioning and performance of the flash.

Sun, Et Al, in a paper *Design of on-chip error correction systems for multilevel NOR and NAND flash memories*, (Circuits, Devices & Systems, Volume: 1, Issue: 3, 2007, pp. 241-249) teaches various encoding possibilities for encoding data in an MLC Flash which was originally designed for 2 bits per cell (4 levels). A strong TCM code, together with partitioning of the cells into 6, 8, and 12 levels, is disclosed. However, the redundancy is still programmed into designated parity areas, thus increasing the flash array size. The mapping in the cases of 6 and 12 levels map 5 bits in to 2 cells in the case of 6 levels and 7 bits in to 2 cells in the case of 12 levels. The mappings of these techniques are not onto and uses multiple-cell based mappings.

U.S. Pat. No. 7,643,342 to Litsyn, Et Al, for Multi-Bit-Per-Cell Flash Memory Device With Non-Bijective Mapping assigned to SanDisk Corporation, teaches the idea of partitioning a cell into non-power-of-two states. The mappings are non-bijective, that is the mappings are either not onto, or the mappings are not single-cell-based, and static partitioning is used.

Conventional techniques typically fail to address where mapping is implemented, and implementation is typically performed in a controller. Performing mapping in the memory has advantages, as is described below as a feature of the present embodiment.

The present embodiment provides a method to optimize the density (reduce the array size) of a flash memory device, while maintaining acceptable and/or required programming and/or read performance. The voltage window of each memory cell is partitioned into a larger number of states than the number of states for which the memory cell was initially designed. In the context of this document, determining the partitioning of the cells is also referred to as "selection of the mode" or "mode selection" of the flash device. Innovative dynamic partitioning of cell states can achieve a relatively higher programming and read performance with reduced complexity, as compared to conventional implementations. Mapping of bits to cell states can be onto and single-cell based mapping is possible (where the data can be partitioned into disjoint sets of bits, and each set of bits effects only the state of a single cell).

Dynamic partitioning of cell states facilitates postponement of a decision regarding the number of states into which each cell should be partitioned. In other words, dynamic mode selection allows mode selection, and re-selection of mode, after manufacturing and/or based on specific operational performance of the memory cells. Typically, flash memories are manufactured in batches, and within the batch, the specific operational performance of each flash memory can vary. Using dynamic partitioning, a decision can be made on a per-flash memory basis, enabling optimal utilization of each flash memory. Mode selection can be done at device manufacturing time, or at device power-on time. The selection of the mode may be effected by a setting of one or more non-volatile elements in the memory, or the selection of the mode may be effected by a command issued to the memory device by an external host.

In a non-limiting example, when an array of memory cells is manufactured, the array may be partitioned so the memory cells each have 16 states. Subsequent to manufacture, firmware in a memory device can measure the reliability of the data programmed into the memory by reading the data at high resolution and computing the voltage distribution of each cell state. Using information regarding the voltage distribution of each cell state, the firmware can decide on an optimal number of states into which the memory cells of the memory should be partitioned and that will actually be employed from that point onward.

Figure 9:
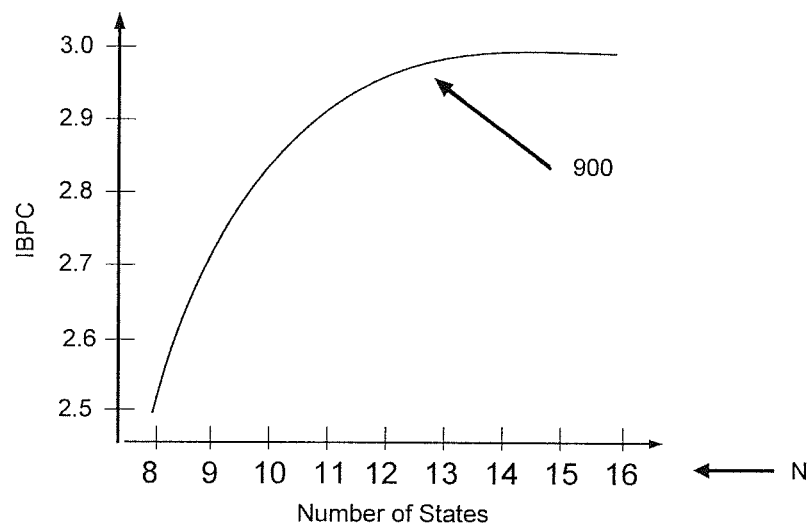
FIG. 9, a plot of IBPC versus a number of memory cell states N.

Referring to FIG. 9, a plot of IBPC versus a number of memory cell states N, as using a different number of cell states N results in a different IBPC. Selection of mode, or in other words how many cell states N into which each cell should be partitioned, can be done using the following: For each N, the number of bits stored in a cell partitioned into N states is $\log_2(N)$. The (raw) Cell Error Rate (CER) for a partitioning into N states may be computed as CER(N). The code-rate required for protecting against a CER of CER(N) is computed as R(N). The number of information bits per cell (IBPC) is therefore: IBPC(N)=R(N)*$\log_2(N)$, and is plotted in FIG. 9. An examination of the example plot of FIG. 9 reveals that increasing the number of states N beyond 13, as shown by the arrow 900 has only a minor effect on the residual IBPC (in other words, does not increase the IBPC significantly as compared to the change in IBPC between cell states less than 13).

Figure 10:
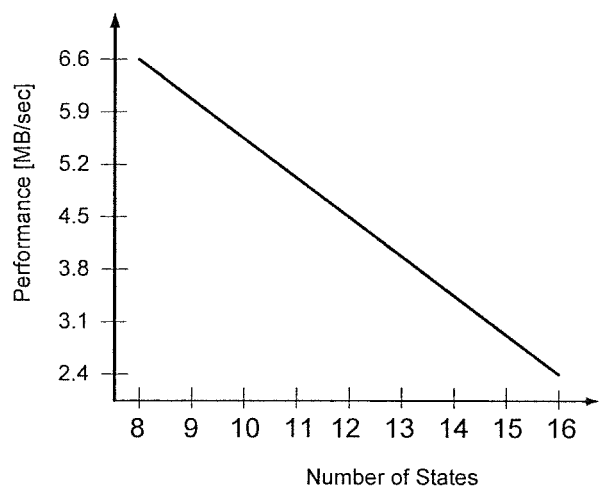
FIG. 10, an exemplary plot of performance versus a number of memory cell states N.

Another factor to consider when increasing the number of states is the reading and programming performance of the flash as a function of N. Referring to FIG. 10, an exemplary plot of performance versus a number of memory cell states N, using a different number of cell states N results in a different write performance. An examination of the plot of FIG. 10 reveals that the programming performance decreases linearly with the number of states N.

Combining the information from the plots of FIGS. 9 and 10 results in selecting a partitioning of 13 cell states, which corresponds to an IBPC of about 2.97 and a raw programming rate of about 3.8 Mbps.

In general, selection of the mode can be done according to various criteria, in particular criteria related to operational performance of the memory cells. For example, the mode can be chosen such that the programming rate using cells with N physical states is not less than a required minimal rate of programming. Alternatively, N is computed such that reading the cells using N physical states can be achieved with a rate not less than a required minimal rate of reading. Alternatively, N is computed such that programming codewords into the flash memory cells can be achieved with a given reliability. Alternatively, N is computed such that decoding the codewords can be achieved with a BER that is not larger than a given maximal BER.

After selecting the number of cell states N into which memory cells are to be partitioned, the memory needs to be programmed into the N cell states. A preferred method for programming the memory uses a 2-stage approach. In a first stage, the memory is virtually partitioned into $2^j$ virtual states, where $2^j > N$ and the user data is virtually programmed using the $2^j$ virtual states. In a second stage, the $2^j$ virtual states are mapped into N physical states by using a many-to-one mapping.

The mapping from $2^j$ to N may be done in a controller of a memory device or inside the memory. Optionally, j=k+1, where k is the integer part of the number of data bits being stored per memory cell, and $2^k < N < 2^k+1$. The memory accepts from a controller bit patterns from the $2^{k+1}$ different bit patterns of (k+1) bits as data for a cell, and the memory maps the $2^{k+1}$ different bit patterns to one of the N states in each cell using a many-to-one mapping scheme. Note that although the same notation (k) is typically used to refer in discussions of encoding to the amount of user data, in the context of cell states, k is a number of data bits being stored per memory cell. The use of k for encoding versus the use of k for determining a number of cell states will be obvious from the context of use. Commonly, many MLC flash memories use an SLC buffer, also known as a binary cache, for initial fast programming of the data bits (that is data from the user, or user data). After initial fast programming, the data is copied/folded from the SLC buffer into an MLC section of the flash. The SLC buffer is a section of the flash memory containing a certain amount of cells that are partitioned into 2 states, thus storing one bit per cell.

In a preferred implementation, the controller 502 programs the memory 510 by using $2^{k+1}$ different states, which enable easy programming of the SLC buffer 514 using k+1 logical pages. Later, when copying the k+1 pages into the MLC section inside the memory 516, each MLC cell has only N available states. A mapper inside the memory, such as memory mapper 512 of FIG. 5, may be used for mapping the k+1 SLC pages into the MLC cells with N states each. This implementation saves valuable time in an implementation as the data need not be sent back to the controller 502 for implementing the mapper in the controller, (such as by memory device mapper 504 of FIG. 5).

In a case where programming the memory requires multiple transfers between the controller 502 and the memory 510, using a transfer to the SLC increases the speed of MLC programming. Therefore, a preferred implementation is to perform the mapping from $2^{k+1}$ states to N states inside the memory.

The following non-limiting examples are provided to clarify the present embodiment. The examples used to assist in the description of this embodiment should not detract from the scope of applicability, validity, and utility of the invention. In a non-limiting example, a flash memory is designed to store 3 information bits in each cell, and the cells are partitioned into 12 states. Since $\log_2(12) \sim 3.5$, a code with a code-rate of approximately ~0.86 may be used. If a host page includes 1024 bits and 3 host pages include the information bits of a word line (WL) of the flash, then the codeword includes a total of 3,584 bits. The 3,584 bits are partitioned into 512 subsets, each of which will include 7 bits. The $2^7=128$ possible configurations of the 7 bits will be mapped into 128 of the possible $12^2=144$ configurations of 2 cells of the flash system.

Figure 11:
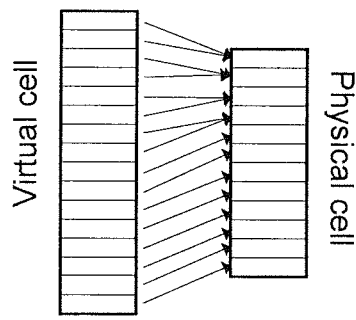
FIG. 11, a first sketch of virtual to physical cell mapping.
Figure 12:
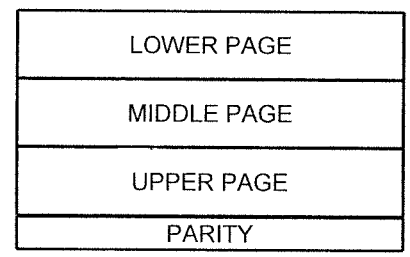
FIG. 12, a diagram of bit storage in a 12-state cell.

Alternatively, a code with a code rate of 0.75 is used to generate a code of length 4,096 bits. The 4,096 bits are partitioned into 1024 subsets where each subset includes 4 bits, (preferably 3 information bits and one parity bit). Therefore, each subset of 4 bits is naturally associated with a single (virtual) cell of 16 states. However, since the number of states in each cell is only 12, the upper 8 virtual states will be partitioned into 4 states, i.e. state 9 and 10 will be merged into one state {9,10}, and also states 11-16 will be merged to form 3 new states {11,12}, {13,14}, {15,16}. The mapping from the virtual cell with 4 bits and 16 states to the physical cell with only 12 states is illustrated in FIG. 11 a first sketch of virtual to physical cell mapping. As shown in FIG. 11, the top 8 states of the virtual cell are partitioned into 4 subsets, each of the subsets created by merging 2 adjacent states of the virtual cell. The physical cell with 12 states per cell can be referred to as a cell carrying 3.5 bits and can be illustrated as in FIG. 12, a diagram of bit storage in a 12-state cell. During decoding, while computing the initial probability values for each bit, the bits of the merged states will be computed accordingly, and for example, the bit that differentiates state 9 from 10 will be given a 0 (zero) reliability.

Another non-limiting example uses an X2 flash memory. In the present example, we want to extend an X2 flash, that is, a flash with 4 states per cell (2 bits per cell), into a system with 6 bits per cell, where each cell will carry an average of 2.1 information bits ($\log_2(6)$). A conventional X2 system would typically use 1024 cells for storing 2 host pages of 1024 bits each for a total of 2048 bits, and an additional 100 cells for storing the parity bits. Thus, the total number of cells that the conventional X2 system uses is approximately 1,124.

Figure 13:
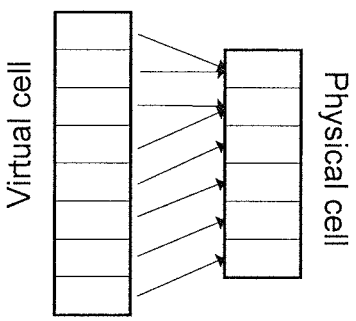
FIG. 13, a second sketch of virtual to physical cell mapping.

In comparison, using a method of the current embodiment, the X2 flash memory is repartitioned so each cell has 6 states, and the same 2 host pages of 1024 bits can be stored in only 976 cells. This is done by first encoding the data by a code with a code rate of approximately 0.7 to generate 2928 bits, i.e. an additional 880 parity bits. The 2,928 code word bits are partitioned into subsets of 3 bits, where each subset of 3 bits is naturally associated with an X3 cell, that is, a cell storing 3 bits. Referring to FIG. 13 a second sketch of virtual to physical cell mapping, similar to the above-described example, the upper 4 states are merged into 2 states {5,6} and {7,8}, thus defining a mapping into the 6 physical states of the flash. In the present example, the number of cells used for storing the codeword is actually less than 1024, which would have been needed for storing just the 2048 information bits in an X2 flash system.

Figure 14:
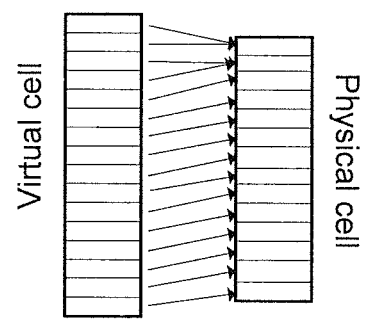
FIG. 14, a third sketch of virtual to physical cell mapping.

In an alternative implementation, the present embodiment can be used while adding a small amount of redundancy cells in order to increase the error resiliency of the system. For example, a 14 state system may reliably store 2.98 information bits per cell. Therefore, 3 pages of 1024 bits each would require 1031 cells. In this case, a code with code rate of approximately 0.74 may be used to generate a code word of length 4124 bits from the 3072 bits of information (3 pages of 1024). The 4124 bits will be mapped into 1031 cells, each cell including 14 states by merging 4 of the upper states of a 16 state cell into 2 states. Refer to FIG. 14, a third sketch of virtual to physical cell mapping, showing mapping from 16 virtual states to 14 physical cell states. The code generated by the present example adds an additional 1% parity, but would be much more powerful than a BCH code with 1% redundancy, (which would be the alternative code used in conjunction with a traditional X3 flash).

Optionally, the controller can map the data into virtual cells, where each virtual cell has M virtual states, and the flash memory subsequently maps the M virtual states into N physical states (cell states). The numbers M and N may differ from each other. Preferably, the mapping into the N physical states is onto, that is, the total number of different bit patterns resulting from the mapping is N, and each of the N physical states has a virtual state mapped to the physical state. In other words, mapping onto uses all of the bit patterns (bits), without leaving any bit patterns unused.

Referring again to FIG. 15, this flowchart of a method for storing bits can be used with alternative encoding and programming. A plurality of data bits are provided 1500. The plurality of data bits are encoded 1052 to generate a codeword (D) that includes a greater number of bits than the data bits (B). A plurality of memory cells are provided 1504. In this case, each memory cell is programmable to a plurality of cell states (N), and for a given integer number k of data bits stored per cell the plurality of cell states is greater than $2^k$ and less than $2^{k+1}$ ($2^k<N<2^{k+1}$). The plurality of memory cells are programmed 1506 to represent the codeword by placing each memory cell in one of the plurality of cell states, wherein the integer number k of bits stored per cell multiplied by a number (C) of the plurality of memory cells is greater than or equal to a number of the data bits and less than the greater number of bits of the codeword ($B<=k \cdot C<D$). This innovative technique adds a number of states to the number of states required for storing an integer number k of data bits in a cell, but does not add enough states to reach the next consecutive power of 2. The additional number of states is used to store the redundancy information for the data bits. In contrast, a conventional technique that is limited to a power of 2 number of states would store at most k bits per cell, or would double the number of states to store k+1 bits per cell. Optionally, the integer number k of bits stored per cell multiplied by a number of the plurality of memory cells is equal to a number of the data bits ($B=k \cdot C$).

Another method for storing a plurality of data bits also includes encoding the plurality of data bits to generate a codeword that includes a greater number of bits than the data bits. At least one memory cell is provided, which has at least two modes of operation. For each of the modes each memory cell is programmable to a respective plurality of cell states. One of the modes of operation is selected for the at least one memory cell based on a criterion related to operational performance of the at least one memory cell. Programming the at least one memory cell to represent the codeword can be done by placing each of the at least one memory cell in one of the plurality of cell states associated with one of the modes of operation for the at least one memory cell. This innovative technique facilitates dynamic selection of the mode of operation for a memory cell, where the mode of operation can by changed, in contrast to static selection where the mode of operation can be chosen one time, normally during manufacturing of the memory cell.

Optionally, a number of the plurality of cell states is a non-integer power of 2. Optionally, an integer number of data bits stored per cell multiplied by a number of the at least one memory cell is greater than or equal to a number of the data bits and less than the greater number of bits of the codeword ($B<=k \cdot C<D$). Optionally, the integer number of data bits stored per cell multiplied by the number of the at least one memory cell is equal to the number of the data bits ($k \cdot C=B$).

In a preferred implementation, for each of the modes, the respective plurality of cell states is a non-integer power of 2. In another preferred implementation, for each of the modes, a number of the respective plurality of cell states is between two consecutive integer powers of 2.

The criterion related to operational performance of the at least one memory cell depends on the specific application for which the memory will be used, and the desired operating parameters for the memory, as described above. The criterion can be based on a value of a parameter of the at least one memory cell, including, but not limited to: minimal rate of programming; minimal rate of reading; reliability of programming; reliability of reading [maximal BER].

Selecting one of the modes of operation can also be based on measuring a variety of value parameters, depending on the specific application and/or as described above. Value parameters related to operational performance of the at least one memory cell include, but are not limited to rate of programming; rate of reading; reliability of programming; reliability of reading.

Selecting one of the modes of operation can also be done at one or more times during the life of a memory. Selecting can be done during manufacturing, during power-on, by setting one or more non-volatile elements associated with the at least one memory cell, or in response to a command issued to the at least one memory cell by an external host. It is foreseen that selecting the mode of operation can be done at other times and by other means, depending on the specifics of the application.

Selection of a mode of operation is typically done by the controller 502, but can also be done by other components, depending on the specific application. One method for selection of mode includes selecting a mode based on a required number of information bits per cell (IBPC). Note that the IBPC can be a non-integer number. In a non-limiting example, the controller may compute a function that will relate the number of states to the required IBPC (refer to FIG. 9 and the related description). Then the controller may choose the number of cell states (N) to be the minimal number of states for which the required IBPC can be achieved. NOTE that the graph in FIG. 9 changes during the lifetime of the memory, since a fresh memory suffers from less errors than an aging memory. Therefore, the number of states of the flash will change dynamically over the lifetime of the memory, as opposed to conventional flash memories where the number of cell states is constant over the life of the memory.

Another option is to choose the number of states that maximizes IBPC, and the performance of the flash is above a required throughput. In this case, the number of states will be chosen as a function as described in reference to FIGS. 9 and 10. Another feature of the present embodiment is the ability to use virtual states and multiple mappings in the controller, memory, or both (multiple) locations in the system. The step of programming can include defining a set of virtual states ($2^j$) greater in number than the plurality of cell states (N). The codeword is mapped to the set of virtual states. The set of virtual states is mapped to the plurality of cell states. Each of the at least one memory cell is placed in one of the plurality of cell states, thus programming the memory cell to represent the codeword. Optionally, a number of the set of virtual states ($2^j$) is a power of two consecutively greater than the integer number k of bits stored per cell (j=k+1).

Referring again to FIG. 5, mapping the codeword to the set of virtual states can be done in the memory device mapper 504 of controller 502 external to a memory 510 including the at least one memory cell 516. Mapping the set of virtual states to the plurality of cell states is preferably done in the memory mapper 512 of the memory 510. In an optional implementation, the set of virtual states is mapped onto the plurality of cell states, where the terminology of onto has been described above. The step of programming can be single-cell based, that is, a codeword of many bits is divided into symbols of a relatively smaller number of bits, typically 3 or 4 bits. Each symbol or goes into a single memory cell. In contrast, other implementations map symbols onto multiple cells.

In general, a plurality of bits, can be stored in a memory, the memory including a plurality of memory cells, wherein each memory cell is programmable to a plurality of cell states (N), and wherein for a given integer number k the plurality of cell states is greater than $2^k$ and less than $2^{k+1}$ ($2^k<N<2^{k+1}$). Bits are received from a controller external to the memory in bit patterns of length k+1 for each memory cell. In the memory, the bit patterns are mapped to the plurality of cell states using a many-to-one mapping. Each memory cell is placed in one of the plurality of cell states respectively corresponding to a bit pattern for each memory cell, thereby programming the plurality of memory cells to represent the bits. A feature of this innovative method for storing a plurality of bits is that the mapping from (k+1) bits associated with a single cell into one of the cell states (N) (that is, the many-to-one mapping), is done inside the memory and not in the controller. Optionally, the memory receives one of $2^{k+1}$ bit patterns of k+1 bits each, for each memory cell, and maps each of the bit patterns to one of the plurality of cell states.

A plurality of bits can be stored by providing at least one memory cell, wherein each memory cell is programmable to a plurality of cell states. Based on a criterion related to operational performance of the at least one memory cell, the plurality of cell states is selected. The at least one memory cell is programmed to represent the bits by placing each of the at least one memory cell in one of the plurality of cell states.

Note that a variety of implementations for modules and processing are possible, depending on the application. Modules are preferably implemented in software, but can also be implemented in hardware and firmware, on a single processor or distributed processors, at one or more locations. The above-described module functions can be combined and implemented as fewer modules or separated into sub-functions and implemented as a larger number of modules. Based on the above description, one skilled in the art will be able to design an implementation for a specific application.

The use of simplified calculations to assist in the description of this embodiment should not detract from the utility and basic advantages of the invention.

It should be noted that the above-described examples, numbers used, and exemplary calculations are to assist in the description of this embodiment. Inadvertent typographical and mathematical errors should not detract from the utility and basic advantages of the invention.

It will be appreciated that the above descriptions are intended only to serve as examples, and that many other embodiments are possible within the scope of the present invention as defined in the appended claims.

What is claimed is:

1. A method for storing a plurality of data bits, the method comprising the steps of:
   (a) encoding the plurality of data bits to generate a codeword comprising at least one parity bit;
   (b) providing a plurality of memory cells, wherein each memory cell is programmable to a plurality of cell states; and
   (c) programming the plurality of memory cells to represent the plurality of data bits and the at least one parity bit, wherein every memory cell is programmed to represent at least one of the plurality of data bits by at least:
   defining a set of $2^j$ virtual states greater in number than the plurality of cell states and wherein j is an integer number;
   mapping the codeword to the set of $2^j$ virtual states;
   mapping the set of $2^j$ virtual states to the plurality of cell states; and
   placing each of the at least one memory cell in one of the plurality of cell states.

2. The method of claim 1 wherein the plurality of cell states are threshold voltage states.

3. The method of claim 1 wherein a number of the plurality of memory cells is an integer factor of a number of the plurality of data bits.

4. The method of claim 1 wherein each memory cell is programmed to represent exactly one parity bit.

5. The method of claim 1 wherein each memory cell is programmed to represent at least one parity bit.

6. The method of claim 1 wherein each memory cell is programmed to represent an equal number of the data bits.

7. The method of claim 1 wherein the encoding generates a plurality of parity bits.

8. The method of claim 7 wherein each memory cell is programmed to represent an equal number of the parity bits.

9. The method of claim 8 wherein each memory cell is programmed to represent an equal number of the data bits.

10. The method of claim 9 wherein a sum of the equal number of the parity bits and the equal number of the data bits is equal to a number of bits of each memory cell, which is logarithm (to base 2) of a number of the plurality of cell states.

11. The method of claim 1 wherein the step of programming includes:
   (i) transferring the plurality of data bits to a buffer of a memory array, that also includes the plurality of memory cells;
   (ii) subsequent to transferring the plurality of data bits to the buffer, transferring the at least one parity bit to the buffer; and
   (iii) subsequent to transferring the at least one parity bit to the buffer, executing the step of programming the plurality of memory cells.

12. The method of claim 11 wherein the storing of the data bits in the buffer is substantially simultaneous with the encoding of the data bits.

13. The method of claim 11 wherein the buffer includes at least one single level flash cell (SLC) wherein the data bits and the at least one parity bit are stored, and wherein each of the plurality of memory cells is a multi level flash cell (MLC).

14. The method of claim 11 wherein the buffer includes at least one first data latch wherein data bits are stored and the at least one second data latch wherein the at least one parity bit are stored, and wherein each of the plurality of memory cells is a flash memory cell.

15. The method of claim 1 wherein the step of programming includes:
(i) programming the plurality of memory cells to represent the plurality of data bits; and
(ii) subsequently to programming the plurality of memory cells to represent the plurality of data bits, programming the plurality of memory cells to additionally represent the at least one parity bit.

16. The method of claim 15 wherein the programming of the plurality of data bits is substantially simultaneous with the encoding of the plurality of data bits.

17. A memory device comprising:
(a) a plurality of memory cells, wherein each memory cell is programmable to a plurality of cell states; and
(b) a controller operative to store a plurality of data bits by:
(i) encoding the plurality of data bits to generate a codeword comprising at least one parity bit; and
(ii) programming the plurality of memory cells to represent the plurality of data bits and the at least one parity bit, wherein every memory cell is programmed to represent at least one of the plurality of data bits by at least:
defining a set of $2^j$ virtual states greater in number than the plurality of cell states and wherein j is an integer number;
mapping the codeword to the set of $2^j$ virtual states;
mapping the set of $2^j$ virtual states to the plurality of cell states; and
placing each of the at least one memory cell in one of the plurality of cell states.

18. A controller for storing a plurality of data bits in a memory that includes a plurality of memory cells, wherein each memory cell is programmable to a plurality of cell states, the controller being operative to:
(a) encode the plurality of data bits to generate a codeword comprising at least one parity bit; and
(b) program the plurality of memory cells to represent the plurality of data bits and the at least one parity bit by placing each memory cell in one of the plurality of cell states, wherein every memory cell is programmed to represent at least one of the plurality of data bits by at least:
defining a set of $2^j$ virtual states greater in number than the plurality of cell states and wherein j is an integer number;
mapping the codeword to the set of $2^j$ virtual states;
mapping the set of $2^j$ virtual states to the plurality of cell states; and
placing each of the at least one memory cell in one of the plurality of cell states.

19. A system for storing a plurality of data bits, the system comprising:
(a) a memory that includes a plurality of memory cells, wherein each memory cell is programmable to a plurality of cell states; and
(b) a processor operative to store the plurality of data bits by:
(i) encoding the plurality of data bits to generate a codeword comprising at least one parity bit; and
(ii) programming the plurality of memory cells to represent the plurality of data bits and the at least one parity bit, wherein every memory cell is programmed to represent at least one of the plurality of data bits by at least:
defining a set of $2^j$ virtual states greater in number than the plurality of cell states and wherein j is an integer number;
mapping the codeword to the set of $2^j$ virtual states;
mapping the set of $2^j$ virtual states to the plurality of cell states; and
placing each of the at least one memory cell in one of the plurality of cell states.

20. A non-transitory computer-readable storage medium having embedded thereon computer-readable code for storing a plurality of data bits, the computer-readable code comprising program code for storing the plurality of data bits in a plurality of memory cells, wherein each memory cell is programmable to a plurality of cell states by:
(a) encoding the plurality of data bits to generate a codeword comprising at least one parity bit; and
(b) programming the plurality of memory cells to represent the plurality of data bits and the at least one parity bit, wherein every memory cell is programmed to represent at least one of the plurality of data bits by at least:
defining a set of $2^j$ virtual states greater in number than the plurality of cell states and wherein j is an integer number;
mapping the codeword to the set of $2^j$ virtual states;
mapping the set of $2^j$ virtual states to the plurality of cell states; and
placing each of the at least one memory cell in one of the plurality of cell states.

21. A method for storing a plurality of data bits, the method comprising the steps of:
(a) encoding the plurality of data bits to generate a codeword that includes a greater number of bits than the data bits;
(b) providing a plurality of memory cells, wherein each memory cell is programmable to a plurality of cell states, and wherein for a given integer number k of data bits stored per cell the plurality of cell states is greater than $2^k$ and less than $2^{k+1}$; and
(c) programming the plurality of memory cells to represent the codeword by placing each memory cell in one of the plurality of cell states, wherein the integer number k of bits stored per cell multiplied by a number of the plurality of memory cells is greater than or equal to a number of the data bits and less than the greater number of bits of the codeword.

22. The method of claim 21 wherein the integer number k of bits stored per cell multiplied by a number of the plurality of memory cells is equal to a number of the data bits.

23. The method of claim 21 wherein the step of programming includes:
(i) defining a set of $2^j$ virtual states greater in number than the plurality of cell states and wherein j is an integer number;
(ii) mapping the codeword to the set of $2^j$ virtual states;
(iii) mapping the set of $2^j$ virtual states to the plurality of cell states; and (iv) placing each of the at least one memory cell in one of the plurality of cell states.

24. The method of claim 23 wherein the number of $2^j$ virtual states is $2^{(k+1)}$.

25. The method of claim 23 wherein mapping the codeword to the set of virtual states is done in a controller external to a memory including the at least one memory cell.

26. The method of claim 23 wherein the set of virtual states is mapped onto the plurality of cell states.

27. A method for storing a plurality of data bits, the method comprising the steps of:
(a) encoding the plurality of data bits to generate a codeword that includes a greater number of bits than the data bits;
(b) providing at least one memory cell, which has at least two modes of operation, wherein for each of the modes each memory cell is programmable to a respective plurality of cell states;
(c) selecting, based on a criterion related to operational performance of the at least one memory cell, one of the modes of operation for the at least one memory cell; and
(d) programming the at least one memory cell to represent the codeword by at least:
defining a set of $2^j$ virtual states greater in number than the plurality of cell states and wherein j is an integer number;
mapping the codeword to the set of $2^j$ virtual states;
mapping the set of $2^j$ virtual states to the plurality of cell states;
selecting a state of the plurality of memory states associated with one of the modes of operation for the at least one memory cell based at least in part on the mapping; and
placing the at least one memory cell in the selected state.

28. The method of claim 27 wherein a number of the plurality of cell states is a non-integer power of 2.

29. The method of claim 28 wherein an integer number of data bits stored per cell multiplied by a number of the at least one memory cell is greater than or equal to a number of the data bits and less than the greater number of bits of the codeword.

30. The method of claim 29 wherein the integer number of data bits stored per cell multiplied by the number of the at least one memory cell is equal to the number of the data bits.

31. The method of claim 27 wherein for each of the modes, the respective plurality of cell states is a non-integer power of 2.

32. The method of claim 27 wherein for each of the modes, a number of the respective plurality of cell states is between two consecutive integer powers of 2.

33. The method of claim 27 wherein the criterion related to operational performance of the at least one memory cell is based on a value of a parameter of the at least one memory cell selected from the group consisting of: minimal rate of programming; minimal rate of reading; reliability of programming; reliability of reading.

34. The method of claim 27 wherein selecting one of the modes of operation is based on measuring a value parameter related to operational performance of the at least one memory cell, selected from the group consisting of: rate of programming; rate of reading; reliability of programming; reliability of reading.

35. The method of claim 27 wherein the step of selecting is done during manufacturing.

36. The method of claim 27 wherein the step of selecting is done during power-on.

37. The method of claim 27 wherein the step of selecting is done by setting one or more non-volatile elements associated with the at least one memory cell.

38. The method of claim 27 wherein the step of selecting is done in response to a command issued to the at least one memory cell by an external host.

39. A method for storing a plurality of data bits, the method comprising the steps of:
(a) encoding the plurality of data bits to generate a codeword that includes a greater number of bits than the data bits;
(b) providing a plurality of memory cells, wherein each memory cell is programmable to a plurality of cell states, and wherein for a given integer number k of data bits stored per cell the plurality of cell states is greater than $2^k$ and less than $2^{k+1}$; and
(c) programming the plurality of memory cells to represent the codeword by at least:
defining a set of $2^j$ virtual states greater in number than the plurality of cell states and wherein j is an integer number;
mapping the codeword to the set of $2^j$ virtual states;
mapping the set of $2^j$ virtual states to the plurality of cell states;
selecting a state of the plurality of memory states for each of the plurality of memory cells based at least in part on the mapping; and
placing each memory cell in a corresponding one of the selected cell states, wherein the integer number k of bits stored per cell multiplied by a number of the plurality of memory cells is less than the greater number of bits of the codeword, and wherein programming is single-cell based.

40. The method of claim 39 wherein the step of programming includes:
(i) defining a set of $2^j$ virtual states greater in number than the plurality of cell states and wherein j is an integer number;
(ii) mapping the codeword to the set of $2^j$ virtual states;
(iii) mapping the set of $2^j$ virtual states to the plurality of cell states; and
(iv) placing each of the at least one memory cell in one of the plurality of cell states.

41. The method of claim 40 wherein the number of $2^j$ virtual states is $2^{(k+1)}$.

42. A method for storing a plurality of bits, the method comprising the steps of:
(a) providing at least one memory cell, which has at least two modes of operation, wherein for each of the modes each memory cell is programmable to a respective plurality of cell states;
(b) selecting, based on a criterion related to operational performance of the at least one memory cell, one of the modes of operation for the at least one memory cell; and
(c) programming the at least one memory cell to represent the bits by at least:
defining a set of $2^j$ virtual states greater in number than the plurality of cell states and wherein j is an integer number;
mapping the codeword to the set of $2^j$ virtual states;
mapping the set of $2^j$ virtual states to the plurality of cell states;

selecting a state of the plurality of memory states associated with one of the modes of operation for the at least one memory cell based at least in part on the mapping; and placing the at least one memory cell in the selected state.

\* \* \* \* \*